United States Patent
Li et al.

(10) Patent No.: US 12,431,361 B2
(45) Date of Patent: Sep. 30, 2025

(54) SELF-ALIGNED DOUBLE PATTERNING WITH SPATIAL ATOMIC LAYER DEPOSITION

(71) Applicant: Applied Materials, Inc., Santa Clara, CA (US)

(72) Inventors: Ning Li, San Jose, CA (US); Victor Nguyen, Novato, CA (US); Mihaela Balseanu, Sunnyvale, CA (US); Li-Qun Xia, Cupertino, CA (US); Keiichi Tanaka, San Jose, CA (US); Steven D. Marcus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 125 days.

(21) Appl. No.: 17/516,096

(22) Filed: Nov. 1, 2021

(65) Prior Publication Data
US 2022/0059362 A1 Feb. 24, 2022

Related U.S. Application Data

(63) Continuation of application No. 14/595,595, filed on Jan. 13, 2015, now Pat. No. 11,164,753.
(Continued)

(51) Int. Cl.
*H01L 21/3065* (2006.01)
*C23C 16/455* (2006.01)
(Continued)

(52) U.S. Cl.
CPC .. *H01L 21/31144* (2013.01); *C23C 16/45551* (2013.01); *H01J 37/32357* (2013.01); *H01J 37/3244* (2013.01); *H01L 21/0337* (2013.01); *H01L 21/68764* (2013.01); *H01L 21/68771* (2013.01)

(58) Field of Classification Search
CPC ......... H01L 21/31144; H01L 21/31116; H01L 21/3086; H01L 21/30655; H01L 21/0234
See application file for complete search history.

(56) References Cited

U.S. PATENT DOCUMENTS

| 4,702,792 A | 10/1987 | Chow |
| 5,186,718 A | 2/1993 | Tepman et al. |

(Continued)

FOREIGN PATENT DOCUMENTS

| CA | 2638452 A1 | 2/2010 |
| CN | 102953052 A | 3/2013 |

(Continued)

OTHER PUBLICATIONS

"GCM 3060 Conductive SU8-negative tone photo-epoxy for thin layers", 2005, 5 pgs.

(Continued)

*Primary Examiner* — Thomas T Pham
(74) *Attorney, Agent, or Firm* — SERVILLA WHITNEY LLC

(57) ABSTRACT

Provided are self-aligned double patterning methods including feature trimming. The SADP process is performed in a single batch processing chamber in which the substrate is laterally moved between sections of the processing chamber separated by gas curtains so that each section independently has a process condition.

16 Claims, 7 Drawing Sheets

Related U.S. Application Data

(60) Provisional application No. 61/926,589, filed on Jan. 13, 2014.

(51) Int. Cl.
  *H01J 37/32* (2006.01)
  *H01L 21/033* (2006.01)
  *H01L 21/311* (2006.01)
  *H01L 21/687* (2006.01)

(56) References Cited

U.S. PATENT DOCUMENTS

| | | |
|---|---|---|
| 8,492,282 B2 | 7/2013 | Devilliers |
| 8,722,321 B2 | 5/2014 | Kobayashi et al. |
| 2004/0026037 A1 | 2/2004 | Shinriki et al. |
| 2004/0084411 A1* | 5/2004 | Du .................... H01L 21/31116 257/E21.252 |
| 2005/0164479 A1 | 7/2005 | Perng et al. |
| 2005/0245094 A1* | 11/2005 | Brodsky ................ G03F 7/091 257/E21.255 |
| 2006/0057843 A1 | 3/2006 | Chen et al. |
| 2007/0122918 A1* | 5/2007 | Park .................... B81C 1/00547 430/311 |
| 2007/0249182 A1 | 10/2007 | Mani et al. |
| 2007/0277735 A1* | 12/2007 | Mokhlesi .......... C23C 16/45527 118/723 R |
| 2008/0026162 A1* | 1/2008 | Dickey ............. C23C 16/45551 427/595 |
| 2008/0261349 A1 | 10/2008 | Abatchev et al. |
| 2008/0305642 A1 | 12/2008 | Lee et al. |
| 2009/0004604 A1* | 1/2009 | Lee .................... H01L 21/0338 430/314 |
| 2009/0004875 A1 | 1/2009 | Shen |
| 2009/0163030 A1 | 6/2009 | Omura et al. |
| 2010/0009470 A1 | 1/2010 | Davis et al. |
| 2010/0029081 A1 | 2/2010 | Wells et al. |
| 2010/0093151 A1 | 4/2010 | Arghavani et al. |
| 2010/0112483 A1 | 5/2010 | Wing Ngai |
| 2010/0136784 A1 | 6/2010 | Mebarki et al. |
| 2010/0210111 A1 | 8/2010 | Tran et al. |
| 2011/0081753 A1 | 4/2011 | Yamanari et al. |
| 2011/0104901 A1 | 5/2011 | Yatsuda et al. |
| 2011/0104907 A1 | 5/2011 | Lee et al. |
| 2011/0163420 A1 | 7/2011 | Valdivia et al. |
| 2011/0171833 A1 | 7/2011 | Nakaune et al. |
| 2011/0183269 A1* | 7/2011 | Zhu ................... H01L 21/31138 430/323 |
| 2011/0206937 A1 | 8/2011 | Schmidt |
| 2012/0108079 A1 | 5/2012 | Mahajani |
| 2012/0164846 A1 | 6/2012 | Ha et al. |
| 2012/0252200 A1 | 10/2012 | Sumiya et al. |
| 2013/0047923 A1 | 2/2013 | Kato |
| 2013/0113085 A1 | 5/2013 | Michaelson et al. |
| 2013/0210238 A1 | 8/2013 | Yudovsky |
| 2014/0065554 A1 | 3/2014 | Liu et al. |
| 2014/0123895 A1* | 5/2014 | Kato .................... H01J 37/321 118/723 VE |
| 2015/0118846 A1* | 4/2015 | Isii .................... H01L 21/0273 438/694 |
| 2015/0279665 A1* | 10/2015 | Zafiropoulo ...... H01L 21/02274 438/785 |

FOREIGN PATENT DOCUMENTS

| | | |
|---|---|---|
| EP | 1394286 A1 | 3/2004 |
| JP | 2008103719 A | 5/2008 |
| JP | 2008306161 A | 12/2008 |
| JP | 2011514662 A | 5/2011 |
| JP | 2012054343 A | 3/2012 |
| JP | 2012199362 A | 10/2012 |
| JP | 2013514633 A | 4/2013 |
| KR | 10-2011-0046872 A | 5/2011 |
| WO | 02081771 A2 | 10/2002 |
| WO | 2007142690 A2 | 12/2007 |
| WO | 2009097436 A3 | 8/2009 |
| WO | 2009150870 A1 | 12/2009 |
| WO | 2011069011 A1 | 6/2011 |
| WO | 2013116478 A | 8/2013 |

OTHER PUBLICATIONS

PCT International Preliminary Report on Patentability in PCT/US2015/011185 dated Jul. 28, 2016, 10 pages.

PCT International Search Report and Written Opinion in PCT/US2015/011185, mailed Apr. 30, 2015, 15 pages.

Goedde, Dean M, et al., "A New Class of CVD Precursors to Metal Borides: Cr(B3H8)2 and Related Octahydrotriborate Complexes", J. Am. Chem. Soc., vol. 126, 2004, 12230-12231.

Hatanaka, Masanobu, et al., "ZrBO dielectrics for TSV production process", IEEE, 3 pgs.

Jayaraman, Sreenivas, et al., "Hafnium Diboride Thin Films by Chemical Vapor Deposition form a Single Source Precursor", J. Vac. Sci. Technol. A 23(6), Nov./Dec. 2005, 1619-1625.

Knyrim, Johanna S., et al., "High-pressure synthesis, crystal structure, and properties of the first ternary hafniumborate b-HfB2O5", Journal of Solid State Chemistry, vol. 180, 2007, pp. 742-748.

Kumar, Navneet, et al., "Low Temperature Chemical Vapor Deposition of Hafnium Nitride-Boron Nitride Nanocomposite Films", Chem. Mater., vol. 21, 2009, 5601-5606.

Li, Hai-Wen, et al., "Recent Progress in Metal Borohydrides for Hydrogen Storage", Energies, vol. 4, 2011, pp. 185-214.

* cited by examiner

SELF-ALIGNED DOUBLE PATTERNING WITH SPATIAL ATOMIC LAYER DEPOSITION

CROSS-REFERENCE TO RELATED APPLICATIONS

This application is a continuation of U.S. application Ser. No. 14/595,595, filed Jan. 13, 2015, which claims priority to U.S. Provisional Application No. 61/926,589, filed Jan. 13, 2014, the entire contents of which are hereby incorporated by reference herein.

BACKGROUND

Embodiments of the present disclosure generally relate to an apparatus for processing substrates. More particularly, the disclosure relates to self-aligned double patterning processing and a batch processing platform for performing same.

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The effectiveness of a substrate processing platform, or system, is often quantified by cost of ownership (COO). The COO, while influenced by many factors, is largely affected by the system footprint, i.e., the total floor space required to operate the system in a fabrication plant, and system throughput, i.e., the number of substrates processed per hour. Footprint typically includes access areas adjacent the system that are required for maintenance. Hence, although a substrate processing platform may be relatively small, if access from all sides is required for operation and maintenance, the system's effective footprint may still be prohibitively large.

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, use an ALD process may be beneficial. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form an uniform material layer on the surface of a substrate. Cycles of reactive precursor and inert purge gases are repeated to form the material layer to a predetermined thickness. The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate. In choosing such ALD and epitaxy processes for better device performance, the cost to fabricate devices in a conventional single substrate processing chamber would increase due to very low substrate processing throughput. Hence, when implementing such processes, a continuous substrate processing approach is needed to be economically feasible.

There is an ongoing need in the art for apparatus and methods of uniformly depositing a film on a substrate in an efficient and cost effective manner.

SUMMARY

Embodiments of the disclosure are directed to processing methods comprising providing a substrate with a first layer and a patterned layer thereon. Portions of the first layer are exposed through the patterned layer. The patterned layer comprises at least one feature having a top surface and a two vertical faces defining a width. The vertical faces are substantially perpendicular to the first layer. The patterned layer is trimmed to reduce the width of the patterned layer. A spacer layer is deposited over the first layer and patterned layer so that the spacer layer forms a film on the portions of the first layer exposed through the patterned layer, the top surface and both vertical faces of the at least one feature. The spacer layer is etched from the top surface of the at least one feature and the portions of the first layer exposed through the patterned layer.

Additional embodiments of the disclosure are directed to processing methods comprising placing a substrate having a first layer and a patterned layer thereon into a processing chamber comprising a plurality of sections. Each section is separated from adjacent sections by a gas curtain. Portions of the first layer are exposed through the patterned layer. The patterned layer comprises at least one feature having a top surface and two vertical faces defining a width. The vertical faces are substantially perpendicular to the first layer. At least a portion of the substrate is exposed to a first process condition to trim the patterned layer to reduce the width of the patterned layer. The substrate is moved laterally through a gas curtain to a second section of the processing chamber. The substrate is exposed to a second process condition to deposit a spacer layer over the first layer and the patterned layer so that the spacer layer forms a film on the portions of the first layer exposed through the patterned layer, the top surface and both vertical faces of the at least one feature. The substrate is moved laterally through a gas curtain to a third section of the processing chamber. The substrate is exposed to a third process condition to etch the spacer layer from the top surface of the at least one feature and the portions of the first layer are exposed through the patterned layer. During lateral movement of the substrate, a first portion of the substrate is exposed to the first process condition at the same time that a second portion of the surface is exposed to the second process conditions and an intermediate portion of the substrate is exposed to the gas curtain.

Further embodiments of the disclosure are directed to processing methods comprising providing a substrate with a first layer comprising a dielectric and a patterned layer thereon. Portions of the first layer are exposed through the patterned layer. The patterned layer comprises at least one feature having a top surface and a two vertical faces defining a width in the range of about 200 Å to about 800 Å. The vertical faces are substantially perpendicular to the first layer. The patterned layer is exposed to a plasma to reduce the width of the patterned layer by an amount greater than about 10 Å so that the trimmed vertical faces are substantially perpendicular to the first layer. A spacer layer comprising one or more of an oxide, a nitride, an oxynitride or a carbonitride is deposited over the first layer and patterned layer so that the spacer layer forms a film on the portions of the first layer exposed through the patterned layer, the top surface and both vertical faces of the at least one feature. The spacer layer is etched from the top surface of the at least one feature and the portions of the first layer are exposed through the patterned layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. The appended drawings illustrate only typical embodiments of this disclosure and are therefore not to be considered limiting, for the disclosure may admit to other equally effective embodiments.

DETAILED DESCRIPTION

Figure 1:
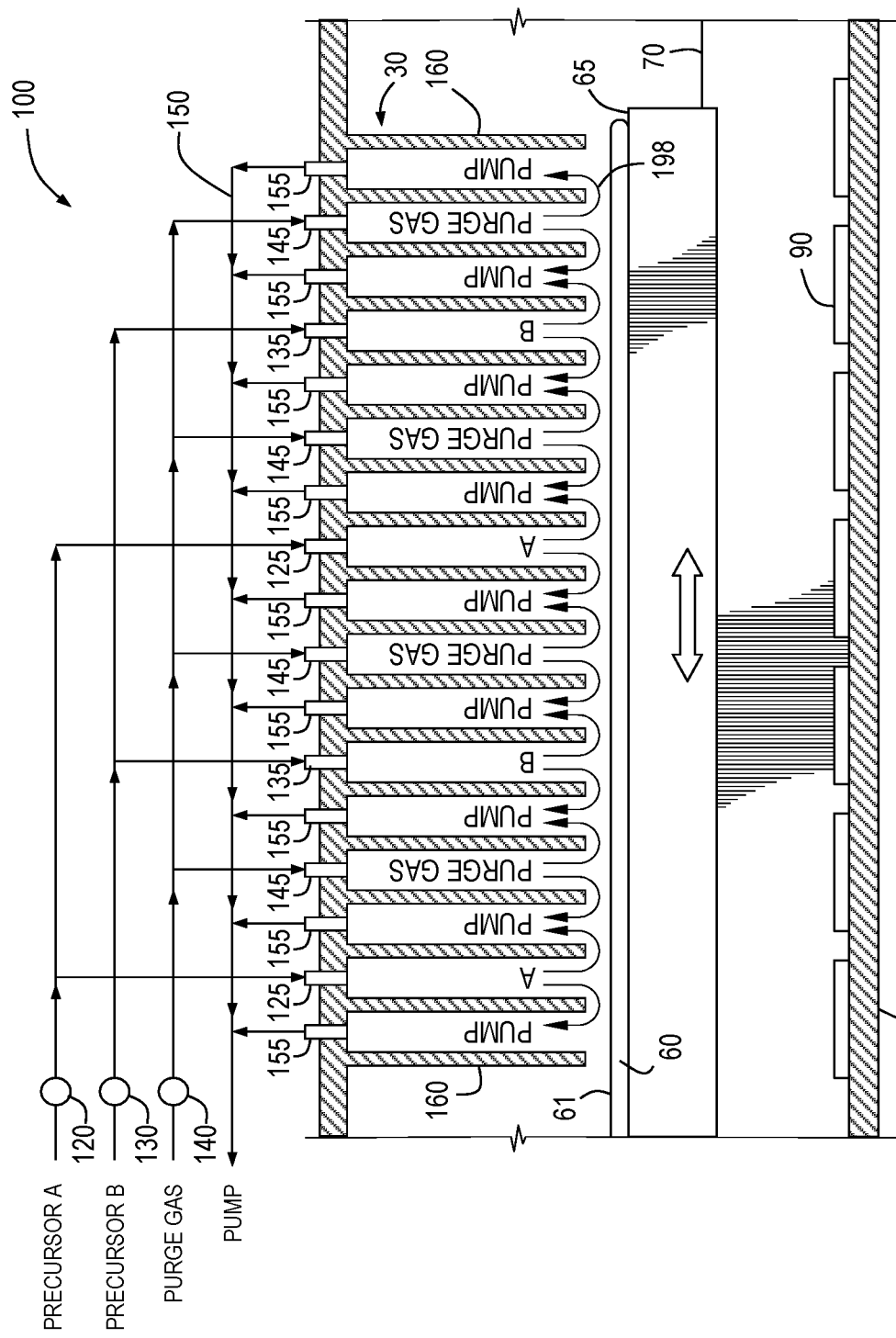
FIG. 1 is a cross-sectional side view of a spatial atomic layer deposition chamber in accordance with one or more embodiment of the disclosure.

Embodiments of the disclosure provide substrate processing systems for continuous substrate deposition to maximize throughput and improve processing efficiency and uniformity. The substrate processing systems can also be used for pre-deposition and post-deposition substrate treatments. Embodiments of the disclosure are related to apparatus and methods for increasing deposition uniformity in a batch processor.

Embodiments of the disclosure are related to double patterning processes used for IC device fabrication in the semiconductor industry. Specifically, embodiments of the disclosure relate to self-aligned double patterning (SADP) technology, photoresist pattern slimming, spacer deposition and spacer etching. Embodiments of the disclosure provide processes using a batch processing system in which SADP steps can be implemented sequentially in a single processing system.

In the batch processing system described, there are multiple gas inlet channels which can be used for introduction of different chemicals or plasma gases. These channels are separated spatially within the processing chamber by inert purging gases and/or vacuum pumping holes which form a gas curtain. The gas curtain ensures that there is minimal or no mixing of gases from different channels to avoid unwanted gas phase reactions. Wafers moving through these different spatially separated channels get sequential and multiple surface exposures to different chemical or plasma environment and thus layer by layer growth in spatial ALD mode or surface etching process become possible. The inventors have discovered that the three SADP processing steps, photoresist (PR) pattern slimming, ALD spacer deposition and spacer etch, can be implemented in a single processing chamber by different processing techniques.

For the PR pattern slimming process, one or more of the plasma channels could be used to perform a dry etch. Wafers moving through these plasma channels get exposed to active etching plasma components, i.e. radicals or ions. Processing parameters can be adjusted to achieve isotropic/anisotropic PR pattern etching/sliming. Specifically, the plasma channel can be switched to either remote or direct mode; the RF frequency, if RF plasma being used, could be adjusted; the gap between the wafer surface and the plasma grounding plate can be changed; oxygen plasma can be mixed with one or more inert gases, such as Ar, He, $N_2$, etc., with different gas compositions; and chamber pressure and wafer temperature (<100° C.) could also be adjusted. By tuning these parameters, the ion energy, composition/density of ions vs. radicals, lifetime of ions/radicals could be tuned to achieve targeted etching/sliming results. Purging and pumping channels in between these plasma channels could effectively take away the by-products from etching process and generate fresh etching surface. PR etch amount can be accurately controlled by the number of plasma exposure times at certain fixed wafer moving speed.

For the low temperature (<100° C.) ALD spacer growth, such as silicon oxide, silicon nitride or silicon carbon nitride, etc., one or more chemical channels plus one or more plasma channels could be used for plasma assisted atomic layer deposition (PEALD) of different spacer materials. For example, the growth of an oxide spacer can be achieved by sequential exposure to an alkylamino silicon precursor and an oxygen plasma. In other words, the wafer being deposited is moving through a processing region with a silicon precursor and a processing region with an $O_2$ plasma. Due to inert gas purging between these two regions, no gas phase mixing/CVD reaction could impact the ALD film growth.

Because of the ALD signature, the as deposited films show excellent within wafer uniformity (<0.5% 1 sigma) and deposition conformality (100%) on 3:1 structure wafers. Additionally, depending on the wafer moving speed, film growth rate can be much faster than traditional time-based ALD system. The spacer film thickness can be accurately controlled by the number of cycles of ALD exposures.

The PR etching during the initial spacer layer growth, especially for oxide growth with direct oxygen plasma. The inventors have surprisingly found that when using direct plasma, an ion blocker can be used to filter out the directional ion components from the plasma channel. Therefore, the oxide deposition process becomes completely radical assisted and the PR etching during oxide film growth could be effectively reduced.

For certain spacer material deposition, more than one chemical can be used for different chemical/plasma channels. For example, during the deposition of SiCN, silicon, carbon and nitrogen source(s) could be fed through different chemical channels. Similarly, the plasma gases being used here could be different for different plasma channels to realize different functionalities, such as, radical assisted film growth or ion assisted film treatment. For the spacer etching, which is similar to the PR slimming process, one or more plasma channels could be used. The plasma conditions and gas compositions being used would be different based on the spacer material being deposited from the previous PEALD process. For example, for oxide spacer, $NF_3$ based plasma might be used for spacer etching.

As used in this specification and the appended claims, the term "substrate" and "wafer" are used interchangeably, both referring to a surface, or portion of a surface, upon which a process acts. Those skilled in the art will understand that reference to a substrate can also refer to only a portion of the substrate, unless the context clearly indicates otherwise. For example, in spatially separated ALD, described with respect to FIG. 1, each precursor is delivered to the substrate, but any individual precursor stream, at any given time, is only delivered to a portion of the substrate. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive in an atomic layer deposition process. For example, a first "reactive gas" may simply adsorb onto the surface of a substrate and be available for further chemical reaction with a second reactive gas.

FIG. 1 is a schematic cross-sectional view of a portion of a processing chamber 20 in accordance with one or more embodiments of the disclosure. The processing chamber 20 is generally a sealable enclosure, which is operated under vacuum, or at least low pressure conditions. The chamber 100 includes a gas distribution assembly 30 capable of distributing one or more gases across the top surface 61 of a substrate 60. The gas distribution assembly 30 can be any suitable assembly known to those skilled in the art, and specific gas distribution assemblies described should not be taken as limiting the scope of the disclosure. The output face of the gas distribution assembly 30 faces the first surface 61 of the substrate 60.

Substrates for use with the embodiments of the disclosure can be any suitable substrate. In some embodiments, the substrate is a rigid, discrete, generally planar substrate. As used in this specification and the appended claims, the term "discrete" when referring to a substrate means that the substrate has a fixed dimension. The substrate of one or more embodiments is a semiconductor substrate, such as a 200 mm or 300 mm diameter silicon substrate. In some embodiments, the substrate is one or more of silicon, silicon germanium, gallium arsenide, gallium nitride, germanium, gallium phosphide, indium phosphide, sapphire or silicon carbide.

The gas distribution assembly 30 comprises a plurality of gas ports to transmit one or more gas streams to the substrate 60 and a plurality of vacuum ports disposed between each gas port to transmit the gas streams out of the processing chamber 20. In the embodiment of FIG. 1, the gas distribution assembly 30 comprises a first precursor injector 120, a second precursor injector 130 and a purge gas injector 140. The injectors 120, 130, 140 may be controlled by a system computer (not shown), such as a mainframe, or by a chamber-specific controller, such as a programmable logic controller. The precursor injector 120 injects a continuous (or pulse) stream of a reactive precursor of compound A into the processing chamber 20 through a plurality of gas ports 125. The precursor injector 130 injects a continuous (or pulse) stream of a reactive precursor of compound B into the processing chamber 20 through a plurality of gas ports 135. The purge gas injector 140 injects a continuous (or pulse) stream of a non-reactive or purge gas into the processing chamber 20 through a plurality of gas ports 145. The purge gas removes reactive material and reactive by-products from the processing chamber 20. The purge gas is typically an inert gas, such as, nitrogen, argon and helium. Gas ports 145 are disposed in between gas ports 125 and gas ports 135 so as to separate the precursor of compound A from the precursor of compound B, avoiding cross-contamination between the precursors.

In another aspect, a remote plasma source (not shown) may be connected to the precursor injector 120 and the precursor injector 130 prior to injecting the precursors into the processing chamber 20. The plasma of reactive species may be generated by applying an electric field to a compound within the remote plasma source. Any power source that is capable of activating the intended compounds may be used. For example, power sources using DC, radio frequency (RF), and microwave (MW) based discharge techniques may be used. If an RF power source is used, the RF power source can be either capacitively or inductively coupled. The activation may also be generated by a thermally based technique, a gas breakdown technique, a high energy light source (e.g., UV energy), or exposure to an x-ray source. Exemplary remote plasma sources are available from vendors such as MKS Instruments, Inc. and Advanced Energy Industries, Inc.

The chamber 100 further includes a pumping system 150 connected to the processing chamber 20. The pumping system 150 is generally configured to evacuate the gas streams out of the processing chamber 20 through one or more vacuum ports 155. The vacuum ports 155 are disposed between each gas port so as to evacuate the gas streams out of the processing chamber 20 after the gas streams react with the substrate surface and to further limit cross-contamination between the precursors.

The chamber 100 includes a plurality of partitions 160 disposed on the processing chamber 20 between each port. A lower portion of each partition extends close to the first surface 61 of substrate 60, for example, about 0.5 mm or greater from the first surface 61. In this manner, the lower portions of the partitions 160 are separated from the substrate surface by a distance sufficient to allow the gas streams to flow around the lower portions toward the vacuum ports 155 after the gas streams react with the substrate surface. Arrows 198 indicate the direction of the gas streams. Since the partitions 160 operate as a physical barrier to the gas streams, they also limit cross-contamination between the precursors. The arrangement shown is merely illustrative and should not be taken as limiting the scope of the disclosure. Those skilled in the art will understand that the gas distribution system shown is merely one possible distribution system and the other types of showerheads and gas distribution assemblies may be employed.

Figure 3:
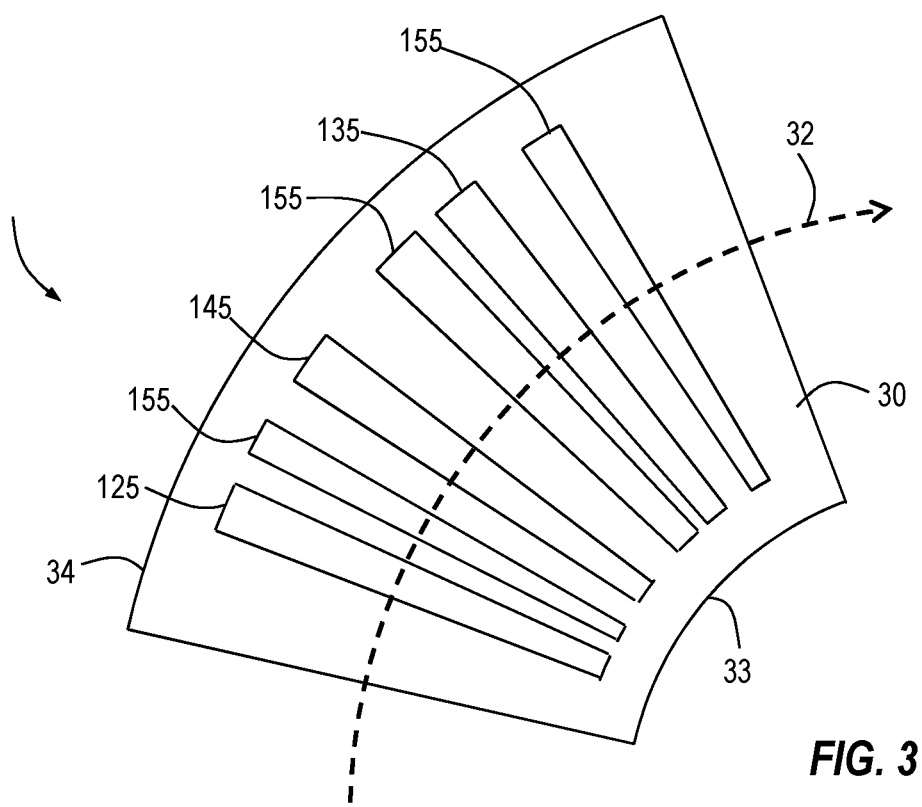
FIG. 3 shows a schematic of a pie-shaped gas distribution assembly in accordance with one or more embodiments of the disclosure.

Atomic layer deposition systems of this sort (i.e., where multiple gases are separately flowed toward the substrate at the same time) are referred to as spatial ALD. In operation, a substrate 60 is delivered (e.g., by a robot) to the processing chamber 20 and can be placed on a shuttle 65 before or after entry into the processing chamber. The shuttle 65 is moved along the track 70, or some other suitable movement mechanism, through the processing chamber 20, passing beneath (or above) the gas distribution assembly 30. In the embodiment shown in FIG. 1, the shuttle 65 is moved in a linear path through the chamber. FIG. 3, as explained further below, shows an embodiment in which wafers are moved in a circular path through a carousel processing system.

Referring back to FIG. 1, as the substrate 60 moves through the processing chamber 20, the first surface 61 of substrate 60 is repeatedly exposed to the reactive gas A coming from gas ports 125 and reactive gas B coming from gas ports 135, with the purge gas coming from gas ports 145 in between. Injection of the purge gas is designed to remove unreacted material from the previous precursor prior to exposing the substrate surface 110 to the next precursor. After each exposure to the various gas streams (e.g., the reactive gases or the purge gas), the gas streams are evacuated through the vacuum ports 155 by the pumping system 150. Since a vacuum port may be disposed on both sides of each gas port, the gas streams are evacuated through the vacuum ports 155 on both sides. Thus, the gas streams flow from the respective gas ports vertically downward toward the first surface 61 of the substrate 60, across the substrate surface 110 and around the lower portions of the partitions 160, and finally upward toward the vacuum ports 155. In this manner, each gas may be uniformly distributed across the substrate surface 110. Arrows 198 indicate the direction of the gas flow. Substrate 60 may also be rotated while being exposed to the various gas streams. Rotation of the substrate may be useful in preventing the formation of strips in the formed layers. Rotation of the substrate can be continuous or in discrete steps and can occur while the substrate is passing beneath the gas distribution assembly 30 or when the substrate is in a region before and/or after the gas distribution assembly 30.

Sufficient space is generally provided after the gas distribution assembly 30 to ensure complete exposure to the last gas port. Once the substrate 60 has completely passed beneath the gas distribution assembly 30, the first surface 61 has completely been exposed to every gas port in the processing chamber 20. The substrate can then be transported back in the opposite direction or forward. If the substrate 60 moves in the opposite direction, the substrate surface may be exposed again to the reactive gas A, the purge gas, and reactive gas B, in reverse order from the first exposure.

The extent to which the substrate surface 110 is exposed to each gas may be determined by, for example, the flow rates of each gas coming out of the gas port and the rate of movement of the substrate 60. In one embodiment, the flow rates of each gas are controlled so as not to remove adsorbed precursors from the substrate surface 61. The width between each partition, the number of gas ports disposed on the processing chamber 20, and the number of times the substrate is passed across the gas distribution assembly may also determine the extent to which the substrate surface 61 is exposed to the various gases. Consequently, the quantity and quality of a deposited film may be optimized by varying the above-referenced factors.

Although description of the process has been made with the gas distribution assembly 30 directing a flow of gas downward toward a substrate positioned below the gas distribution assembly, this orientation is not limiting and can be different. In some embodiments, the gas distribution assembly 30 directs a flow of gas upward toward a substrate surface. As used in this specification and the appended claims, the term "passed across" means that the substrate has been moved from one side of the gas distribution assembly to the other side so that the entire surface of the substrate is exposed to each gas stream from the gas distribution plate. Absent additional description, the term "passed across" does not imply any particular orientation of gas distribution assemblies, gas flows or substrate positions.

In some embodiments, the shuttle 65 is a susceptor 66 for carrying the substrate 60. Generally, the susceptor 66 is a carrier which helps to form a uniform temperature across the substrate. The susceptor 66 is movable in both directions (left-to-right and right-to-left, relative to the arrangement of FIG. 1) or in a circular direction (relative to FIG. 3). The susceptor 66 has a top surface 67 for carrying the substrate 60. The susceptor 66 may be a heated susceptor so that the substrate 60 may be heated for processing. As an example, the susceptor 66 may be heated by radiant heat lamps 90, a heating plate, resistive coils, or other heating devices, disposed underneath the susceptor 66.

Figure 2:
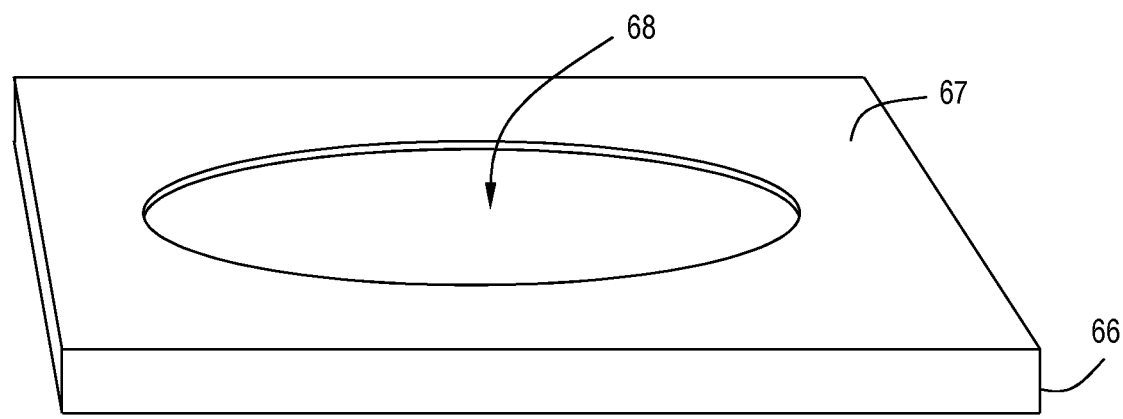
FIG. 2 shows a perspective view of a susceptor in accordance with one or more embodiments of the disclosure.

In still another embodiment, the top surface 67 of the susceptor 66 includes a recess 68 to accept the substrate 60, as shown in FIG. 2. The susceptor 66 is generally thicker than the thickness of the substrate so that there is susceptor material beneath the substrate. In some embodiments, the recess 68 is sized such that when the substrate 60 is disposed inside the recess 68, the first surface 61 of substrate 60 is level with, or substantially coplanar with, the top surface 67 of the susceptor 66. Stated differently, the recess 68 of some embodiments is sized such that when a substrate 60 is disposed therein, the first surface 61 of the substrate 60 does not protrude above the top surface 67 of the susceptor 66. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, 0.10 mm or ±0.05 mm.

FIG. 1 shows a cross-sectional view of a processing chamber in which the individual gas ports are shown. This embodiment can be either a linear processing system in which the width of the individual gas ports is substantially the same across the entire width of the gas distribution plate, or a pie-shaped segment in which the individual gas ports change width to conform to the pie shape. FIG. 3 shows a portion of a pie-shaped gas distribution assembly 30. A substrate would be passed across this gas distribution assembly 30 in an arc shape path 32. Each of the individual gas ports 125, 135, 145, 155 have a narrower width near the inner peripheral edge 33 of the gas distribution assembly 30 a and a larger width near the outer peripheral edge 34 of the gas distribution assembly 30. The shape or aspect ratio of the individual ports can be proportional to, or different from, the shape or aspect ratio of the gas distribution assembly 30 segment. In some embodiments, the individual ports are shaped so that each point of a wafer passing across the gas distribution assembly 30 following path 32 would have about the same residence time under each gas port. The path of the substrates can be perpendicular to the gas ports. In some embodiments, each of the gas distribution assemblies comprises a plurality of elongate gas ports which extend in a direction substantially perpendicular to the path traversed by a substrate. As used in this specification and the appended claims, the term "substantially perpendicular" means that the general direction of movement is approximately perpendicular to the axis of the gas ports. For a pie-shaped gas port, the axis of the gas port can be considered to be a line defined as the mid-point of the width of the port extending along the length of the port. As described further below, each of the individual pie-shaped segments can be configured to deliver a single reactive gas or multiple reactive gases separated spatially or in combination (e.g., as in a typical CVD process).

Figure 4:
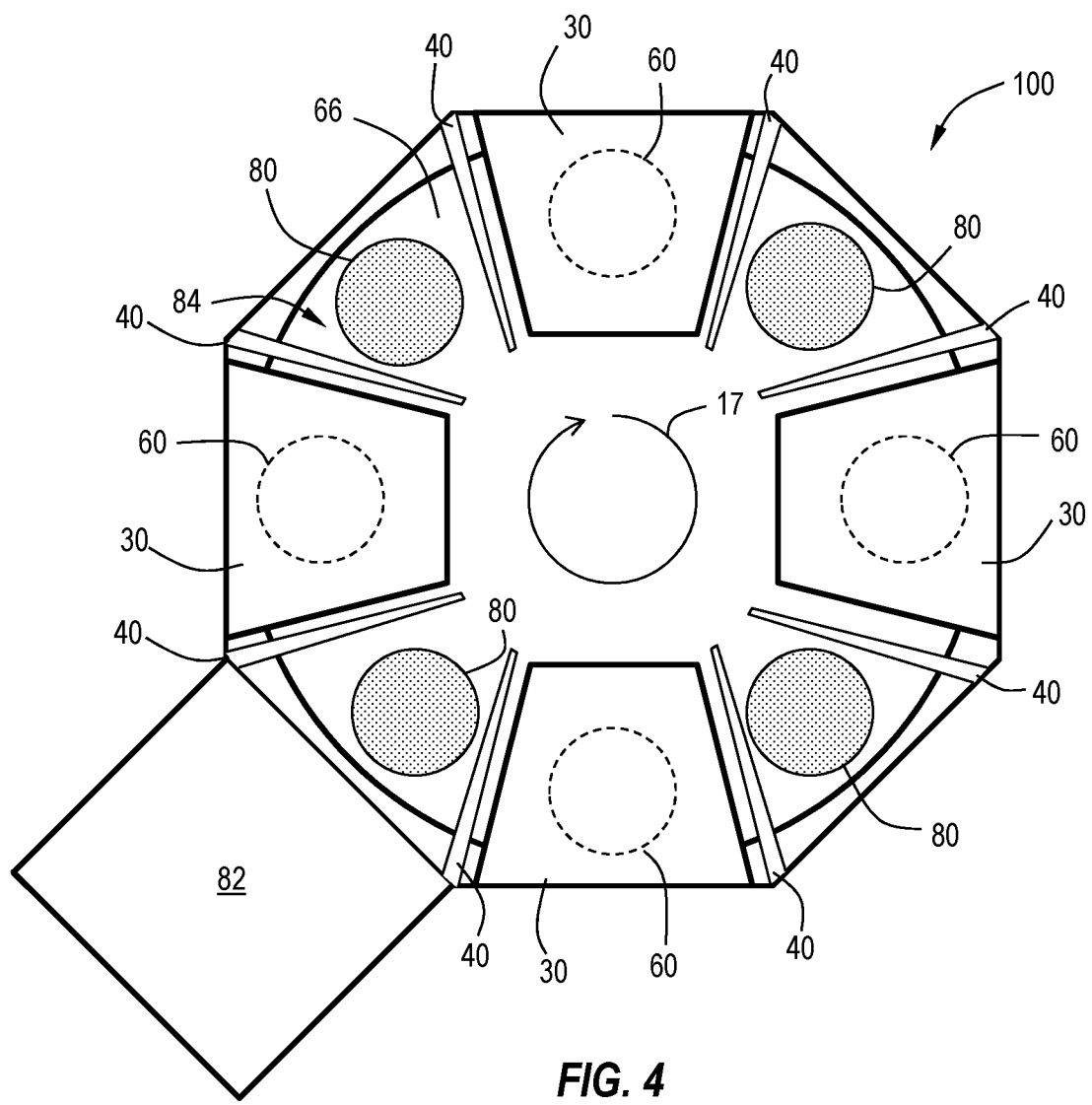
FIG. 4 is a schematic plan view of a substrate processing system configured with four gas distribution assembly units with a loading station in accordance with one or more embodiments of the disclosure.

Processing chambers having multiple gas injectors can be used to process multiple wafers simultaneously so that the wafers experience the same process flow. For example, as shown in FIG. 4, the processing chamber 100 has four gas distribution assemblies 30 and four substrates 60. At the outset of processing, the substrates 60 can be positioned between the gas distribution assemblies 30. Rotating the susceptor 66 of the carousel by 45° will result in each substrate 60 being moved to a gas distribution assembly 30 (also referred to as an injector assembly) for film deposition. This is the position shown in FIG. 4. An additional 45° rotation would move the substrates 60 away from the gas distribution assemblies 30. With spatial ALD injectors, a film is deposited on the wafer during movement of the wafer relative to the injector assembly. In some embodiments, the susceptor 66 is rotated so that the substrates 60 do not stop beneath the gas distribution assemblies 30. The number of substrates 60 and gas distribution assemblies 30 can be the same or different. In some embodiments, there is the same number of wafers being processed as there are gas distribution assemblies. In one or more embodiments, the number of wafers being processed are an integer multiple of the number of gas distribution assemblies. For example, if there are four gas distribution assemblies, there are 4× wafers being processed, where x is an integer value greater than or equal to one.

The processing chamber 100 shown in FIG. 4 is merely representative of one possible configuration and should not be taken as limiting the scope of the disclosure. Here, the processing chamber 100 includes a plurality of gas distribution assemblies 30. In the embodiment shown, there are four gas distribution assemblies 30 evenly spaced about the processing chamber 100. The processing chamber 100 shown is octagonal, however, those skilled in the art will understand that this is one possible shape and should not be taken as limiting the scope of the disclosure. The gas distribution assemblies 30 shown are rectangular, but those skilled in the art will understand that the gas distribution assemblies can be pie-shaped segments, like that shown in FIG. 3. Additionally, each segment can be configured to deliver gases in a spatial type arrangement with multiple different reactive gases flowing from the same segment or configured to deliver a single reactive gas or a mixture of reactive gases.

The processing chamber 100 includes a substrate support apparatus, shown as a round susceptor 66 or susceptor assembly. The substrate support apparatus, or susceptor 66, is capable of moving a plurality of substrates 60 beneath each of the gas distribution assemblies 30. A load lock 82 might be connected to a side of the processing chamber 100 to allow the substrates 60 to be loaded/unloaded from the chamber 100.

The processing chamber 100 may include a plurality, or set, of first treatment stations 80 positioned between any or each of the plurality of gas distribution assemblies 30. In some embodiments, each of the first treatment stations 80 provides the same treatment to a substrate 60.

The number of treatment stations and the number of different types of treatment stations can vary depending on the process. For example, there can be one, two, three, four, five, six, seven or more treatment stations positioned between the gas distribution assemblies 30. Each treatment stations can independently provide a different treatment from every other set of treatments station, or there can be a mixture of the same type and different types of treatments. In some embodiments, one or more of the individual treatments stations provides a different treatment than one or more of the other individual treatment stations. The embodiment shown in FIG. 4 shows four gas distribution assemblies with spaces between which can include some type of treatment station. However, the processing chamber can readily be incorporated with eight gas distribution assemblies with the gas curtains between.

Figure 5:
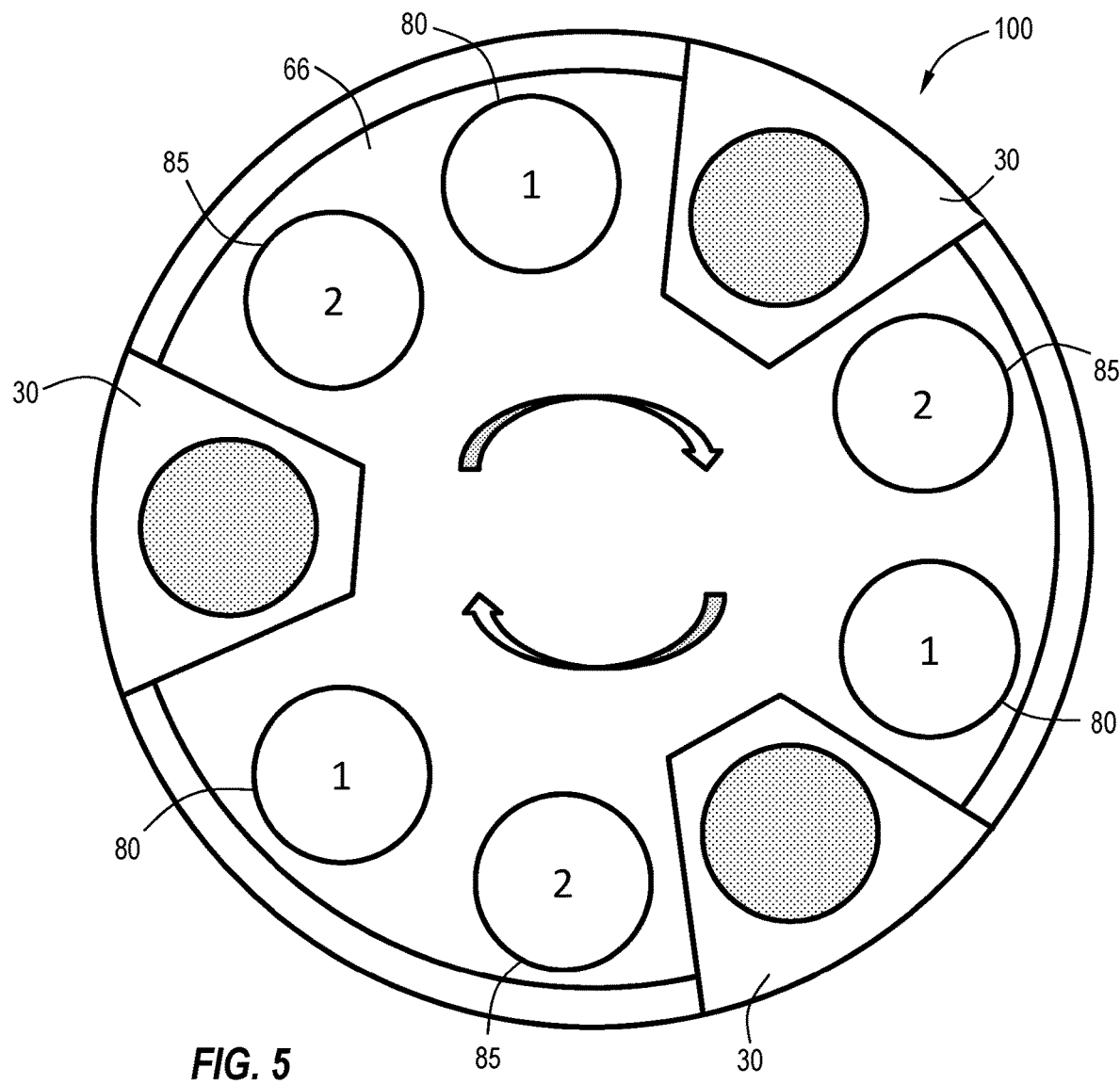
FIG. 5 is a schematic plan view of a substrate processing system configured with three gas distribution assembly units.

In the embodiment shown in FIG. 5, a set of second treatment stations 85 are positioned between the first treatment stations 80 and the gas distribution assemblies 30 so that a substrate 60 rotated through the processing chamber 100 would encounter, depending on where the substrate 60 starts, a gas distribution assembly 30, a first treatment station 80 and a second treatment station 85 before encountering a second of any of these. For example, as shown in FIG. 5, if the substrate started at the first treatment station 80, the substrate would be exposed to, in order, the first treatment station 80, a gas distribution assembly 30 and a second treatment station 85 before encountering another first treatment station 85.

Treatment stations can provide any suitable type of treatment to the substrate, film on the substrate or susceptor assembly. For example, UV lamps, flash lamps, plasma sources and heaters. The wafers are then moved between positions with the gas distribution assemblies 30 to a position with, for example, a showerhead delivering plasma to the wafer. The plasma station being referred to as a treatment station 80. In one or more example, silicon nitride films can be formed with plasma treatment after each deposition layer. As the ALD reaction is, theoretically, self-limiting as long as the surface is saturated, additional exposure to the deposition gas will not cause damage to the film.

Rotation of the carousel can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where rotation can pause again. Pausing between the injectors may provide time for additional processing between each layer deposition (e.g., exposure to plasma).

In some embodiments, the processing chamber comprises a plurality of gas curtains 40. Each gas curtain 40 creates a barrier to prevent, or minimize, the movement of processing gases from the gas distribution assemblies 30 from migrating from the gas distribution assembly regions and gases from the treatment stations 80 from migrating from the treatment station regions. The gas curtain 40 can include any suitable combination of gas and vacuum streams which can isolate the individual processing sections from the adjacent sections. In some embodiments, the gas curtain 40 is a purge (or inert) gas stream. In one or more embodiments, the gas curtain 40 is a vacuum stream that removes gases from the processing chamber. In some embodiments, the gas curtain 40 is a combination of purge gas and vacuum streams so that there are, in order, a purge gas stream, a vacuum stream and a purge gas stream. In one or more embodiments, the gas curtain 40 is a combination of vacuum streams and purge gas streams so that there are, in order, a vacuum stream, a purge gas stream and a vacuum stream. The gas curtains 40 shown in FIG. 4 are positioned between each of the gas distribution assemblies 30 and treatment stations 80, however, the curtains can be positioned at any point or points along the processing path.

Figure 6:
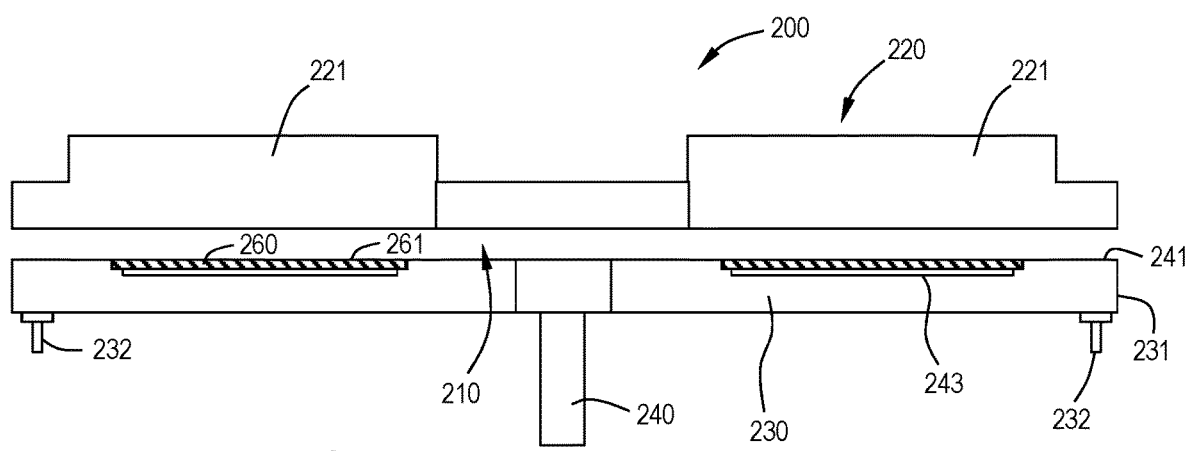
FIG. 6 shows a cross-sectional view of a processing chamber in accordance with one or more embodiments of the disclosure.

FIG. 6 shows an embodiment of a processing chamber 200 including a gas distribution assembly 220, also referred to as the injectors, and a susceptor assembly 230. In this embodiment, the susceptor assembly 230 is a rigid body. The rigid body of some embodiments has a droop tolerance no larger than 0.05 mm. Actuators 232 are placed, for example, at three locations at the outer diameter region of the susceptor assembly 230. As used in this specification and the appended claims, the terms "outer diameter" and "inner diameter" refer to regions near the outer peripheral edge and the inner edge, respectively. The outer diameter is not to a specific position at the extreme outer edge (e.g., near shaft 240) of the susceptor assembly 230, but is a region near the outer edge 231 of the susceptor assembly 230. This can be seen in FIG. 6 from the placement of the actuators 232. The number of actuators 232 can vary from one to any number that will fit within the physical space available. Some embodiments have two, three, four or five sets of actuators 232 positioned in the outer diameter region 231. As used in this specification and the appended claims, the term "actuator" refers to any single or multi-component mechanism which is capable of moving the at least a portion of the susceptor assembly toward or away from the gas distribution assembly 220. For example, actuators 232 can be used to ensure that the susceptor assembly 230 is substantially parallel to the injector assembly 220. As used in this specification and the appended claims, the term "substantially parallel" used in this regard means that the parallelism of the components does not vary by more than 5% relative to the distance between the components.

Once pressure is applied to the susceptor assembly 230 from the actuators 232, the susceptor assembly 230 can be levelled. As the pressure is applied by the actuators 232, the gap 210 distance can be set to be within the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The susceptor assembly 230 is positioned beneath the gas distribution assembly 220. The susceptor assembly 230 includes a top surface 241 and, optionally, at least one recess 243 in the top surface 241. The recess 243 can be any suitable shape and size depending on the shape and size of the wafers 260 being processed. In the embodiment shown, the recess 241 has a step region around the outer peripheral edge of the recess 243. The steps can be sized to support the outer peripheral edge of the wafer 260. The amount of the outer peripheral edge of the wafer 260 that is supported by the steps can vary depending on, for example, the thickness of the wafer and the presence of features already present on the back side of the wafer.

In some embodiments, as shown in FIG. 6, the recess 243 in the top surface 241 of the susceptor assembly 230 is sized so that a wafer 260 supported in the recess 243 has a top surface 261 substantially coplanar with the top surface 241 of the susceptor assembly 230. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, 0.10 mm or ±0.05 mm.

The susceptor assembly 230 of FIG. 6 includes a support post 240 which is capable of lifting, lowering and rotating the susceptor assembly 230. The susceptor assembly 230 may include a heater, or gas lines, or electrical components within the center of the support post 240. The support post 240 may be the primary means of increasing or decreasing the gap between the susceptor assembly 230 and the gas distribution assembly 220, moving the susceptor assembly 230 into rough position. The actuators 232 can then make micro-adjustments to the position of the susceptor assembly to create the predetermined gap.

Figure 7:
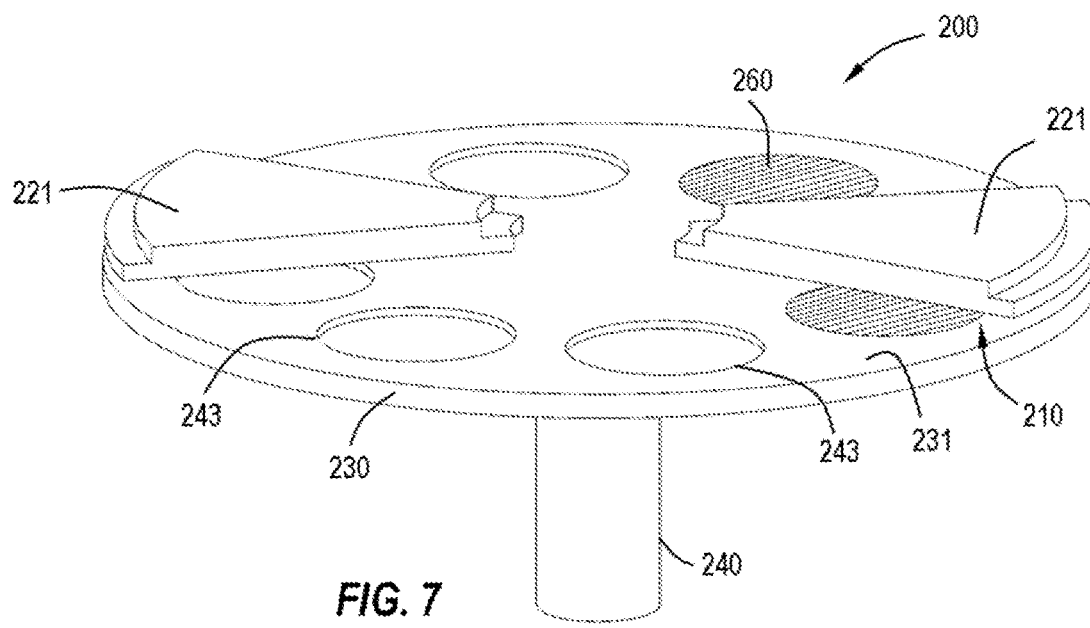
FIG. 7 shows a perspective view of a susceptor assembly and gas distribution assembly units in accordance with one or more embodiments of the disclosure.

The processing chamber 100 shown in FIG. 6 is a carousel-type chamber in which the susceptor assembly 230 can hold a plurality of wafers 260. The gas distribution assembly 220 may include a plurality of separate injector units 221, each injector unit 221 being capable of depositing a film or part of a film on the wafer 260, as the wafer is moved beneath the injector unit 221. FIG. 7 shows a perspective view of a carousel-type processing chamber 200. Two pie-shaped injector units 221 are shown positioned on approximately opposite sides of and above the susceptor assembly 230. This number of injector units 221 is shown for illustrative purposes only. However, more or less injector units 221 can be included. In some embodiments, there are a sufficient number of pie-shaped injector units 221 to form a shape conforming to the shape of the susceptor assembly 230. In some embodiments, each of the individual pie-shaped injector units 221 may be independently moved, removed and/or replaced without affecting any of the other injector units 221. For example, one segment may be raised to permit a robot to access the region between the susceptor assembly 230 and gas distribution assembly 220 to load/unload wafers 260.

Figure 8:
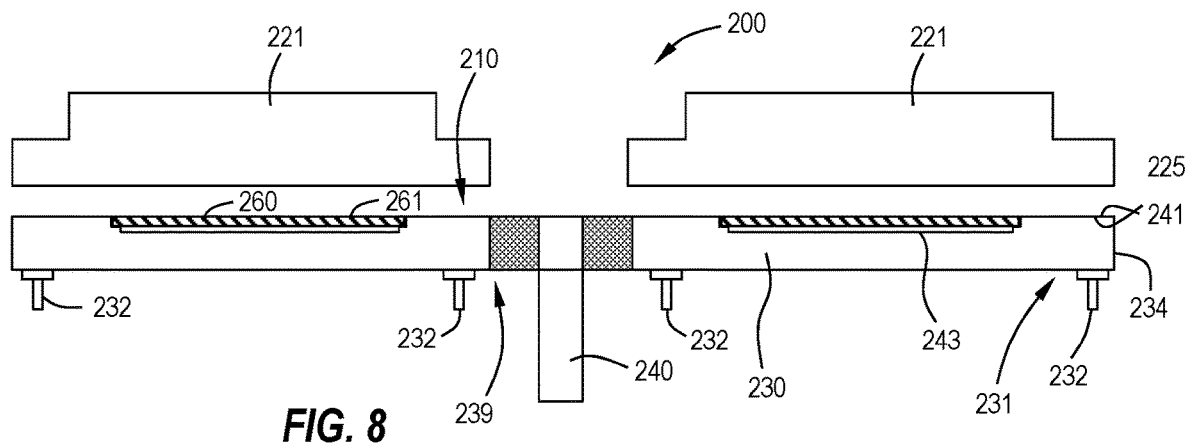
FIG. 8 shows a cross-sectional view of a processing chamber in accordance with one or more embodiments of the disclosure.

FIG. 8 shows another embodiment of the disclosure in which the susceptor assembly 230 is not a rigid body. In some embodiments, the susceptor assembly 230 has a droop tolerance of not more than about 0.1 mm, or not more than about 0.05 mm, or not more than about 0.025 mm, or not more than about 0.01 mm. Here, there are actuators 232 placed at the outer diameter region 231 and at the inner diameter region 239 of the susceptor assembly 230. The actuators 232 can be positioned at any suitable number of places around the inner and outer periphery of the susceptor assembly 230. In some embodiments, the actuators 232 are placed at three locations at both the outer diameter region 231 and the inner diameter region 239. The actuators 232 at both the outer diameter region 231 and the inner diameter region 239 apply pressure to the susceptor assembly 230.

Figure 9:
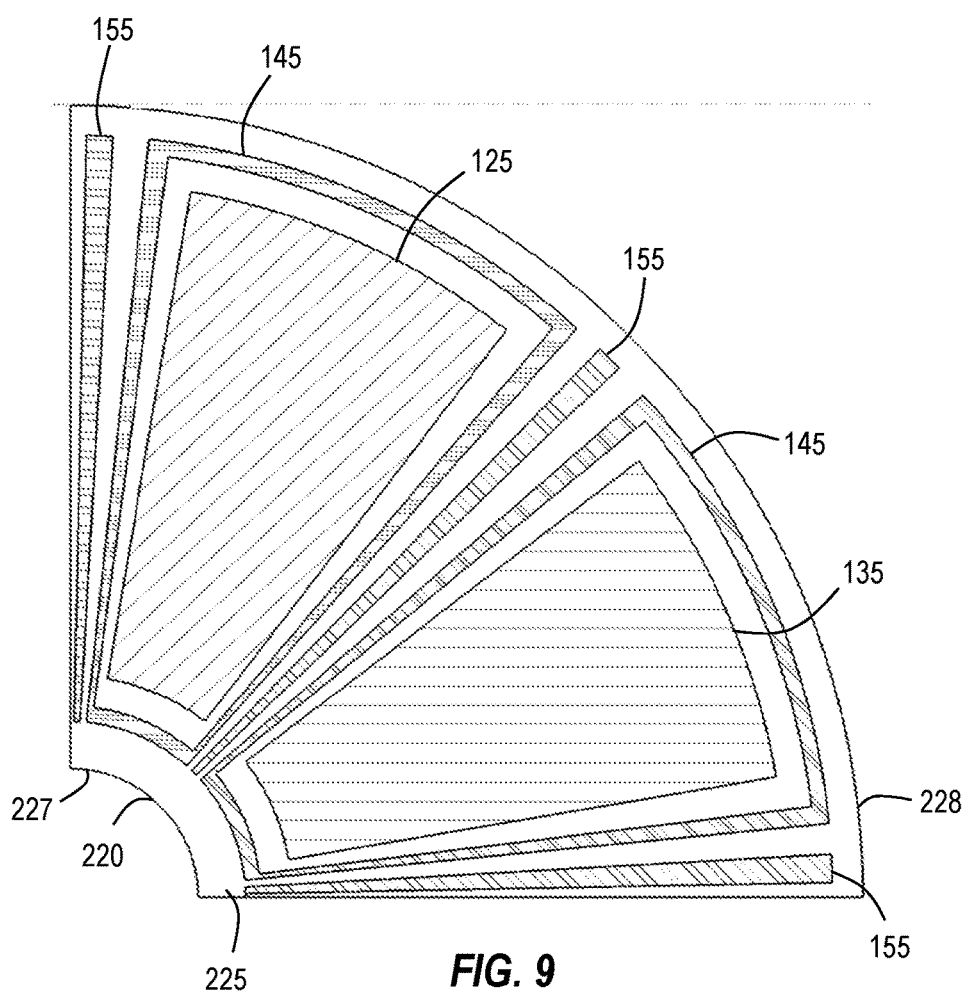
FIG. 9 shows a schematic of a pie-shaped gas distribution assembly in accordance with one or more embodiments of the disclosure.

FIG. 9 shows an embodiment of a processing chamber comprising a circular gas distribution assembly with a diverter and a susceptor assembly. The circular gas distribution assembly 220, a portion of which can be seen in FIG.

9 is positioned within the processing chamber and comprises a plurality of elongate gas ports 125, 135, 145 in a front face 225 of the gas distribution assembly 220. The plurality of elongate gas ports 125, 135, 145 extend from an area adjacent the inner peripheral edge 227 toward an area adjacent the outer peripheral edge 228 of the gas distribution assembly 220. The plurality of gas ports shown in FIG. 9 include a first reactive gas port 125, a second reactive gas port 135, a purge gas port 145 which surrounds each of the first reactive gas ports and the second reactive gas ports and vacuum ports 155.

A susceptor assembly 230 is positioned within the processing chamber to rotate at least one substrate in a substantially circular path about a rotational axis. As used in this specification and the appended claims, the term "substantially circular" means that the path is intended to be circular if the substrate were to complete a full rotation. The susceptor assembly has a top surface 241 (as shown in FIG. 8) defined by an inner peripheral edge 229 and an outer peripheral edge 231. The susceptor assembly 230 is positioned below the gas distribution assembly 220 so that the top surface 241 of the susceptor assembly 230 faces the front face 225 of the gas distribution assembly 220.

Some embodiments of the disclosure are directed to methods of processing a substrate. A substrate is placed into a processing chamber which has a plurality of sections, with each section separated from adjacent sections by a gas curtain. As used in this specification and the appended claims, the terms "section", "region" and "sector" are used interchangeably to describe an area within a batch processing chamber. For example, the component shown in FIG. 9 has two sections. Upon entering the processing chamber, the substrate (also called a wafer) can be in any of the individual sections. Each section can have the same or different processing conditions from the adjacent sections. As used in this specification and the appended claims, the term "processing condition" means the entirety of the conditions within the individual section. For example, processing conditions include, but are not limited to, gas composition, pressure, flow rate, temperature and plasma. Processing conditions can be configured to, for example, deposition, etching and treatment (e.g., densification, annealing).

In the first section, the substrate, or a portion of the substrate, is exposed to a first process condition to deposit a first film on the surface of the substrate. The substrate surface can be a bare substrate surface or any layer previously deposited on the surface. For example, the surface may have a mixed composition with one part being a metal and the other a dielectric. The individual surface composition can vary and should not be taken as limiting the scope of the disclosure. The first process conditions in the first section comprise one or more of a temperature change or a first reactive gas. As used in this specification and the appended claims, the use of the first reactive gas in the first process conditions, as well as other sections of the processing chamber, means the composition, pressure, flow rates, direct plasma, remote plasma and combinations thereof of the reactive gas.

Any of the films deposited or formed can be a complete film, such as a metal or dielectric film, or can be a partial film as in the first half of a two-step reaction. An example of a partial film would be the chemisorption of a compound to a substrate surface that will later be reduced or oxidized to produce the final film. The first film can be part of an atomic layer deposition process in which the first film is a partial or complete film or part of a chemical vapor deposition process. In a CVD process, the first process conditions may include a mixture of reactive gases which react in the gas phase to create an activated species which then deposits onto the substrate surface. In some processes, the film formed in a section has improved qualities than the film entering the section. For example, a film formed in the third section may be exposed to a densification process in the fourth section. The film formed can be from chemical, physical or a combination of processes.

After formation of the first film, the substrate is laterally moved through a gas curtain to a second section of the processing chamber. In the second section, the first film is exposed to second process conditions to form a second film. The second process conditions comprise one or more of temperature change or a second reactive gas to form the second film. The second film can be a different composition than the first film, as in the second half of a two-part reaction or a film having a completely different composition, as in a mixed film.

During the movement from the first section to the second section, the substrate is exposed to the first process conditions, the second process conditions and a gas curtain which separates the two. The gas curtain can be, for example, a combination of inert gases and vacuum to ensure that there is minimal, if any, gas phase reaction between the first process conditions and the second process conditions. At some time during the movement, part of the surface is exposed to the first process conditions, another part of the surface is exposed to the second process conditions and an intermediate portion, between the other two portions, of the substrate is exposed to the gas curtain.

Each of the first process conditions, second process conditions and any other process conditions are selected from the group consisting of a single reactive gas comprising the first reactive gas, a mixture of reactive gases comprising the first reactive gas, a remote plasma comprising the first reactive gas, a direct plasma comprising the first reactive gas, temperature change and combinations thereof. As used in this specification and the appended claims, the term "direct plasma" means a plasma that is ignited within the processing chamber. The term "remote plasma" means a plasma that is ignited outside of the processing chamber and flowed into the processing chamber.

The exposure to the first process conditions and the second process conditions can be repeated sequentially to grow a film of predetermined thickness. For example, the batch processing chamber may contain two sections with the first process conditions and two sections of the second process conditions in alternating pattern, so that rotation of the substrate around the central axis of the processing chamber causes the surface to be sequentially and repeatedly exposed to the first and second process conditions so that each exposure causes the film thickness (for depositions) to grow.

Figure 10A:
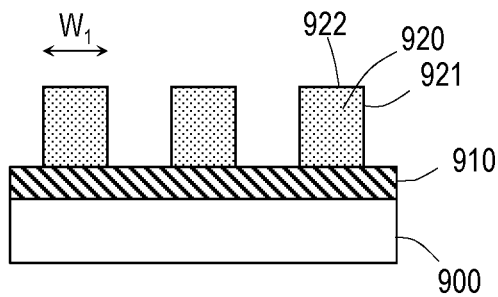
FIGS. 10A-10F are an illustration of a self-aligned double patterning process in accordance with one or more embodiment of the disclosure.

FIGS. 10A through 10F show a typical self-aligned double patterning (SADP) process in accordance with one or more embodiments of the disclosure. The process shown and described an be performed with any suitable oxides, dielectrics, photoresists and/or metal layers. In FIG. 10A, a substrate 900 is layered with a dielectric 910 and patterned with a photoresist 920. Although dielectric 910 is shown deposited on the substrate 900 with a photoresist 920 thereon, those skilled in the art will understand that there can be intervening layers between the substrate 900 and the dielectric 910, or layers between the dielectric 910 and the photoresist 920. Additionally, the dielectric 910 layer can be a different material (e.g., a metal layer).

Figure 10B:
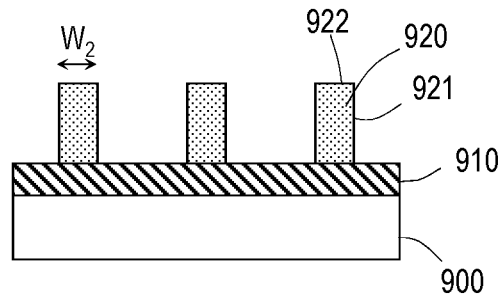

As shown in FIG. 10B, the photoresist 920 can be exposed to a plasma to etch the sides 921 of the photoresist. By etching the sides of the photoresist 920, the width of the photoresist is decreased resulting in a slimmer photoresist and a larger area of dielectric 910 exposed. This process is referred to as photoresist slimming or PR slimming.

Figure 10C:
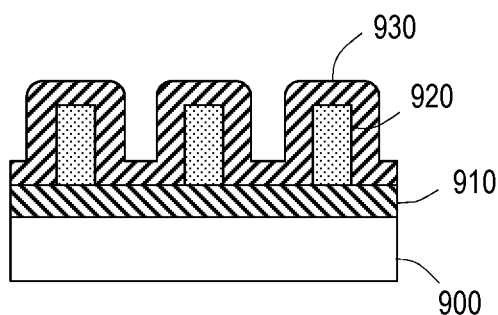

As shown in FIG. 10C, a spacer film 930 is deposited over the exposed surface of the dielectric 910 and the photoresist 920 so that the top 922 and sides 921 of the photoresist 920 are conformally coated with the spacer film 930. The spacer film can be made from any suitable material including, but not limited to, an oxide film.

Figure 10D:
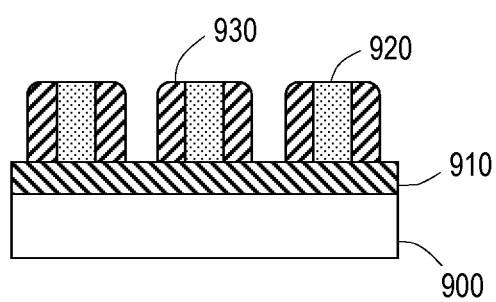
Figure 10E:
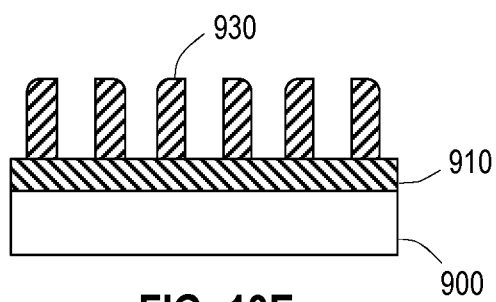

In FIG. 10D, the spacer film 930 has been etched from horizontal surfaces. This means that the top 922 of the photoresist 920 is exposed and part of the dielectric 910 surface is exposed. In FIG. 10E, the original patterned photoresist 920 is etched away, leaving only what is left of spacer film 930. The substrate 900 can be etched using the spacers as a guide, and the remaining dielectric 910 and spacer film 930 stripped to provide the etched substrate 900 in FIG. 10F. The selectivity between the films described herein, such as the dielectric, allows for this process to be carried out. If there is insufficient selectivity, a cap, such as SiON, can be placed on the photoresist prior to the deposition of the spacer film. These caps prevent unintentionally etching away patterned photoresist.

Accordingly, with reference to FIGS. 10A to 10F, one or more embodiments of the disclosure are directed to processing methods. A substrate 900 is provided which has a first layer, which may be dielectric 910, and a patterned layer, which may be photoresist 920. Although the first layer does not need to be a dielectric and the patterned layer does not need to be a photoresist, these terms are used for convenience of description. Portions of the first layer are exposed through the patterned layer so that when looking down at the substrate, both the first layer and the patterned layer are visible at the same time.

The patterned layer comprises at least one feature having a top surface 922 and two sides 921 (i.e., the vertical faces) defining a width $W_1$. The width $W_1$ can be any suitable width for a patterned layer. In some embodiments, the width of the at least one feature is in the range of about 200 Å to about 800 Å, or in the range of about 300 Å to about 700 Å or in the range of about 400 Å to about 600 Å.

The feature or features present on the substrate can be made by any suitable technique and may be formed prior to placing the substrate within the processing chamber. In some embodiments, the features are formed within the same processing chamber and the SADP processing. The features can be any suitable size and any suitable aspect ratio. In some embodiments the aspect ratio of the feature is greater than about 1:1, 2:1, 3:1, 4:1 or 5:1. In some embodiments, the feature has an aspect ratio in the range of about 1:1 to about 20:1, or in the range of about 2:1 to about 15:1, or in the range of about 3:1 to about 10:1, or in the range of about 4:1 to about 8:1.

The vertical faces 921 of the feature are substantially perpendicular to the first layer. As used in this specification and the appended claims, the term "substantially perpendicular" means that the vertical faces form an angle relative to the first layer in the range of about 80° to about 100°, or in the range of about 85° to about 95°, or in the range of about 88° to about 92°.

The patterned layer can be any suitable material depending on the use of the patterned layer. In the example shown in FIGS. 10A through 10F, a self-aligned double patterning procedure is described in which the patterned layer is one or more of a photoresist or spin-on-carbon.

The patterned layer (e.g., photoresist 920) is exposed to processing conditions to reduce the width of the patterned layer from $W_1$ to $W_2$. Accordingly, width $W_2$ is less than width $W_1$. In some embodiments, to reduce the width of the patterned layer, trimming is done by exposing the patterned layer to a plasma. The plasma can be any suitable plasma including, but not limited to, hydrogen, nitrogen, oxygen, argon, carbon dioxide and helium. In some embodiments, the patterned layer comprises spin-on-carbon and the plasma comprises argon and carbon dioxide.

The amount of material removed from the sides of the feature can be controlled by the amount of exposure to the plasma. In some embodiments, the patterned layer width is reduced by an amount in the range of about 10 Å to about 200 Å, or in the range of about 20 Å to about 150 Å, or in the range of about 30 Å to about 100 Å. In one or more embodiments, the patterned layer width is reduced by an amount greater than about 10%, 15%, 20%, 25%, 30%, 35%, 40%, 45% or 50% of the initial width. The width of the feature has been slimmed while not being reduced to zero, meaning that there is some usable feature remaining. After trimming the feature, the vertical faces remain substantially perpendicular to the first layer.

Referring to FIG. 10C, a spacer layer (e.g., an oxide film 930) is deposited over the first layer and patterned layer so that the spacer layer forms a film on the portions of the first layer exposed through the patterned layer, the top surface and both vertical faces of the at least one feature. The spacer layer deposited can be substantially conformal, meaning that the thickness of the spacer layer is uniform across the horizontal and vertical surfaces. As used in this specification and the appended claims, the term "substantially conformal" means that the thickness of the film does not vary by more than about 20%, 15%, 10% or 5% relative to the average film thickness. The spacer layer can be made from any suitable material including, but not limited to, oxides, nitrides, silicides, oxynitrides, carbonitrides and combinations thereof.

Referring to FIG. 10D, the spacer layer is etched from the horizontal surfaces, leaving the spacer layer on the vertical faces. Here, the top surface of the feature and the horizontal portions between features is etched, exposing the top surface of the feature and first layer.

The individual processes can be performed in separate processing chambers or a single processing chamber as described herein. In some embodiments, each process occurs in a single processing chamber in which the substrate is moved laterally between a plurality of sections, each section separated from adjacent sections by a gas curtain. In embodiments of this sort, trimming the patterned layer occurs in a first section of the processing chamber, depositing the spacer layer occurs in a second section of the processing chamber and etching the spacer layer occurs in a third section of the processing chamber. For example, a processing method of this sort can comprise placing the substrate into a processing chamber comprising a plurality of sections, each section separated from adjacent sections by a gas curtain. At least a portion of the substrate is exposed to a first process condition to trim the patterned layer to reduce the width of the patterned layer. The substrate is laterally moved through a gas curtain to a second section of the processing chamber. In the second section of the processing chamber, at least a portion of the substrate is exposed to a second process condition to deposit the spacer layer over the first layer and the patterned layer. The substrate is then laterally moved through a gas curtain to a third section of the processing chamber. At least a portion of the substrate is then exposed to a third process condition to etch the spacer layer from the top surface of the at least one feature and the portions of the first layer exposed through the patterned layer. During lateral movement of the substrate from the first section to the second section, a first portion of the substrate is exposed to the first process condition at the same time that a second portion of the surface is exposed to the second process conditions and an intermediate portion of the substrate is exposed to the gas curtain. The intermediate portion being some portion of the substrate between the first portion and the second portion. During lateral movement of the substrate from the second section to the third section, a first portion of the substrate is exposed to the second process condition at the same time that a second portion of the substrate is exposed to the third process condition and an intermediate portion of the substrate is exposed to the gas curtain.

Figure 10F:

FIGS. 10E and 10F show additional process stages which may be performed in the same processing chamber or different environments. In FIG. 10E, the patterned layer is removed. This process may be referred to as "core removal" and is often, but not required to be, done by wet chemical methods. In FIG. 10F, the remaining spacer layer and exposed portions of the first layer are etched away from the substrate.

In some embodiments, one or more layers may be formed during a plasma enhanced atomic layer deposition (PEALD) process. In some processes, the use of plasma provides sufficient energy to promote a species into the excited state where surface reactions become favorable and likely. Introducing the plasma into the process can be continuous or pulsed. In some embodiments, sequential pulses of precursors (or reactive gases) and plasma are used to process a layer. In some embodiments, the reagents may be ionized either locally (i.e., within the processing area) or remotely (i.e., outside the processing area). In some embodiments, remote ionization can occur upstream of the deposition chamber such that ions or other energetic or light emitting species are not in direct contact with the depositing film. In some PEALD processes, the plasma is generated external from the processing chamber, such as by a remote plasma generator system. The plasma may be generated via any suitable plasma generation process or technique known to those skilled in the art. For example, plasma may be generated by one or more of a microwave (MW) frequency generator or a radio frequency (RF) generator. The frequency of the plasma may be tuned depending on the specific reactive species being used. Suitable frequencies include, but are not limited to, 2 MHz, 13.56 MHz, 40 MHz, 60 MHz and 100 MHz. Although plasmas may be used during the deposition processes disclosed herein, plasmas may not be required. Indeed, other embodiments relate to deposition processes under very mild conditions without a plasma.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or the substrate can be moved from the first chamber to one or more transfer chambers, and then moved to the separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. The details of one such staged-vacuum substrate processing apparatus is disclosed in U.S. Pat. No. 5,186,718, entitled "Staged-Vacuum Wafer Processing Apparatus and Method," Tepman et al., issued on Feb. 16, 1993. However, the exact arrangement and combination of chambers may be altered for purposes of performing specific portions of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discreet steps. For example, a substrate may be rotated throughout the entire process, or the substrate can be rotated by a small amount between exposure to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A processing method for self-aligned double patterning, the processing method comprising:
    exposing a patterned layer of a substrate to a plasma, the substrate having a first layer and the patterned layer thereon, portions of the first layer exposed through the patterned layer, the patterned layer comprising a feature having a top surface and two vertical faces defining an initial width prior to exposing the patterned layer to the plasma and with an aspect ratio greater than about 3:1, the two vertical faces substantially perpendicular to the first layer;
    reducing the initial width of the patterned layer by an amount greater than or equal to about 30% of the initial width of a feature;
    depositing a substantially conformal spacer layer over the first layer and patterned layer by radical assisted ALD with a direct plasma and an ion blocker at a temperature less than 100° C., the ion blocker filtering out ionic components from the direct plasma, so that the substantially conformal spacer layer forms a film on the portions of the first layer exposed through the patterned layer, the top surface and both vertical faces of the feature; and
    etching the substantially conformal spacer layer from the top surface of the feature and the portions of the first layer exposed through the patterned layer,
    wherein each of exposing the pattern layer to the plasma, depositing the substantially conformal spacer layer and the etching the spacer layer occurs in a single processing chamber in which the substrate is moved laterally between a plurality of sections, each section separated from adjacent sections by a gas curtain,
    wherein during the substrate being moved laterally:
        a first portion of the substrate is exposed to one of the exposing the patterned layer, reducing the initial width of the patterned layer, depositing the substantially conformal spacer layer, or etching the conformal spacer layer,
        at the same time that a second portion of the substrate is exposed to a different one of the exposing the patterned layer, reducing the initial width of the patterned layer, depositing the substantially conformal spacer layer, or etching the conformal spacer layer, and
        at the same time that an intermediate portion of the substrate is exposed to the gas curtain.

2. The processing method of claim 1, wherein the patterned layer comprises one or more of a photoresist or spin-on-carbon.

3. The processing method of claim 1, wherein the patterned layer has an initial width in the range of about 200 Å to about 800 Å.

4. The processing method of claim 1, wherein the patterned layer comprises a dielectric.

5. The processing method of claim 1, wherein the patterned layer has an aspect ratio in the range of about 3:1 to about 20:1.

6. The processing method of claim 1, wherein the patterned layer comprises spin-on-carbon.

7. The processing method of claim 1, the initial width is reduced by an amount in the range of about 10 Å to about 200 Å.

8. The processing method of claim 1, wherein after exposing the patterned layer to the plasma, the vertical faces are substantially perpendicular to the first layer.

9. The processing method of claim 1, wherein the spacer layer comprises one or more of an oxide, a nitride or a carbonitride.

10. The method of claim 1, further comprising removing the patterned layer followed by etching the spacer and exposed first layer.

11. A processing method for self-aligned double patterning, the processing method comprising:
    exposing at least a portion of a substrate with a first layer and a patterned layer thereon to a first process condition in a first section of a processing chamber and exposing portions of the first layer through the patterned layer, the patterned layer comprising a feature having a top surface and two vertical faces defining an initial width prior to exposing the at least the portion of the substrate to the first process condition, the feature having an aspect ratio greater than or equal to about 3:1, the two vertical faces substantially perpendicular to the first layer, the first process condition comprising a plasma;
    trimming the patterned layer and reducing the initial width by greater than or equal to about 40% of the initial width;
    laterally moving the substrate through a gas curtain comprising a purge gas stream and a vacuum stream to a second section of the processing chamber;
    exposing the substrate to radical assisted ALD with a direct plasma and an ion blocker at a temperature less than 100° C., the ion blocker filtering out ionic components from the direct plasma, to deposit a substantially conformal spacer layer over the first layer and the patterned layer so that the substantially conformal spacer layer forms a film on the portions of the first layer exposed through the patterned layer, the top surface and both vertical faces of the feature;
    laterally moving the substrate through a gas curtain comprising a purge gas stream and a vacuum stream to a third section of the processing chamber; and
    exposing the substrate to a third process condition to etch the substantially conformal spacer layer from the top surface of the at least one feature and the portions of the first layer exposed through the patterned layer,
    wherein during lateral movement of the substrate, a first portion of the substrate is exposed to the first process condition at the same time that a second portion of the substrate is exposed to the second process condition and an intermediate portion of the substrate is exposed to the gas curtain.

12. The processing method of claim 11, wherein the patterned layer has an initial width in the range of about 200 Å to about 800 Å.

13. The processing method of claim 11, wherein trimming the patterned layer reduced the width by an amount in the range of about 10 Å to about 200 Å.

14. The processing method of claim 11, wherein the spacer layer comprises one or more of an oxide, a nitride or a carbonitride.

15. The method of claim 11, further comprising removing the patterned layer followed by etching the spacer and exposed first layer.

16. A processing method for self-aligned double patterning, the processing method comprising:
- exposing a substrate layer to a plasma, the substrate having a first layer comprising a dielectric and a patterned layer comprising spin-on-carbon thereon, portions of the first layer exposed through the patterned layer, the patterned layer comprising a feature having a top surface and two vertical faces defining an initial width in the range of about 200 Å to about 800 Å, with an aspect ratio greater than about 3:1, the two vertical faces substantially perpendicular to the first layer, wherein exposing the substrate to the plasma reduces the initial width of the patterned layer by an amount greater than or equal to about 50% of the initial width and the vertical faces remain substantially perpendicular to the first layer; and
- depositing a substantially conformal spacer layer comprising a silicide over the first layer and patterned layer by radical assisted ALD with a direct plasma and an ion blocker at a temperature less than 100° C., the ion blocker filtering out ionic components from the direct plasma, so that the substantially conformal spacer layer forms a film on the portions of the first layer exposed through the patterned layer, the top surface and both vertical faces of the feature; and
- etching the substantially conformal spacer layer from the top surface of the feature and the portions of the first layer exposed through the patterned layer,
- wherein each of exposing the substrate to the plasma, depositing the substantially conformal spacer layer and the etching the spacer layer occurs in a single processing chamber in which the substrate is moved laterally between a plurality of sections, each section separated from adjacent sections by a gas curtain, wherein during the lateral movement a first portion of the substrate is exposed to one of exposing the substrate layer, depositing the substantially conformal spacer layer and etching the substantially conformal spacer layer, at the same time that a second portion of the substrate is exposed to a different one of exposing the substrate layer, depositing the substantially conformal spacer layer, or etching the substantially conformal spacer layer, and an intermediate portion of the substrate is exposed to the gas curtain.

* * * * *